United States Patent

[11] 3,569,957

[72] Inventor Robert J. Masterson
San Jose, Calif.

[21] Appl. No. 786,215
[22] Filed Dec. 23, 1968
[45] Patented Mar. 9, 1971
[73] Assignee International Business Machines Corporation Armonk, N.Y.

[54] ANALOG TO DIGITAL CONVERTER WITH ISOLATED INPUTS
9 Claims, 4 Drawing Figs.

[52] U.S. Cl. .......... 340/347
[51] Int. Cl. .......... H03k 13/20
[50] Field of Search .......... 340/347; 324/99; 235/154, 150.51, 183; 328/127

[56] References Cited

UNITED STATES PATENTS

| | | | |
|---|---|---|---|
| 3,178,701 | 4/1965 | Woolam et al. | 340/347 |
| 3,267,458 | 8/1966 | Anderson | 340/347 |
| 3,368,149 | 2/1968 | Wasserman | 340/347 |
| 3,439,271 | 4/1969 | Metcalf et al. | 340/347 |

*Primary Examiner*—Maynard R. Wilbur
*Assistant Examiner*—Charles D. Miller
*Attorneys*—Hanifin and Jancin and Otto Schmid, Jr.

ABSTRACT: An analog to digital converter with isolated inputs is provided wherein each of a plurality of input signal channels comprises a transformer and a source of input signals. A second transformer is coupled between the first transformer and the source of input signals and a source of pulses is coupled through the second transformer to actuate a chopper means for producing a modulated signal proportional to the input to the secondary of the transformer. The modulated signal from a selected channel is coupled to an integrating means for a predetermined time as a digital signal generating means is actuated. At the expiration of the predetermined time the polarity of the input signal is detected and a reference voltage input channel is energized to couple to the input of the integrator a reference voltage of the opposite polarity to the input signal while the digital signal generating means is actuated. When the output of the integrator reaches its initial level, the digital signal generating means then holds the digital representation of the input signal.

*INVENTOR*
ROBERT J. MASTERSON
BY Otto Schmid, Jr.
ATTORNEY

ANALOGUE TO DIGITAL CONVERTER WITH ISOLATED INPUTS

CROSS REFERENCE TO RELATED APPLICATIONS

"Triple Integrating Ramp Analog to Digital Converter" by Hans Bent Aasnaes filed Jun. 27, 1967, Ser. No. 649,161.

BACKGROUND OF THE INVENTION

This invention relates to analog to digital converters and more particularly to analog to digital converters (ADC) which have a plurality of isolated inputs. Many large scale information handling systems utilize data which is in analog form and in many of these applications, a plurality of analog signals is present representing a wide dynamic range in signal amplitude, It is generally desirable to convert the analog signals to digital form for use in the information handling systems and it is desirable to time share a single ADC to convert a number of the analog information signals into digital form. From many system standpoints it is desirable to have each of the analog information signal sources isolated from the other parts of the system. Previous methods of isolating input signals have employed single pulse systems that require transformers with very little pulse droop which are costly and difficult to build and have high interwinding capacitances which are difficult to shield. Other prior art systems have used high frequency pulses transformers and an operation which requires integrating the signal over many input pulse periods. This system requires a demodulator and filter with extremely sharp cutoff characteristics to prevent impairing the frequency response of the input signal channel.

It is therefore an object of this invention to provide an improved analog to digital converter with transformer isolated inputs.

It is another object of this invention to provide an improved integrating ramp ADC which does not load the analog input circuit during the time the digital output is being determined.

SUMMARY OF THE INVENTION

Briefly, according to the invention, there is provided an analog to digital converter wherein a plurality of unknown analog input signals are each coupled through an input signal channel comprising a first transformer and a second transformer through which a pulse source is coupled to energize a chopping means to provide a modulated signal proportional to the analog input at the secondary of the first transformer. The modulated signal is integrated for a predetermined time as a means for generating digital representations is activiated. A reference signal of opposite polarity to the unknown input signal is then selected and the reference signal channel is coupled to the input of the integrator and the reference signal is integrated until the output of the integrator again reaches its initial level. The means for generating digital representations is operated at the same rate as before and the digital representation is then provided in the means for generating digital representations.

The foregoing and other objects, features and advantages of the invention will be apparent from the following more particular description of a preferred embodiment of the invention as illustrated in the accompanying drawings.

Figure 1:
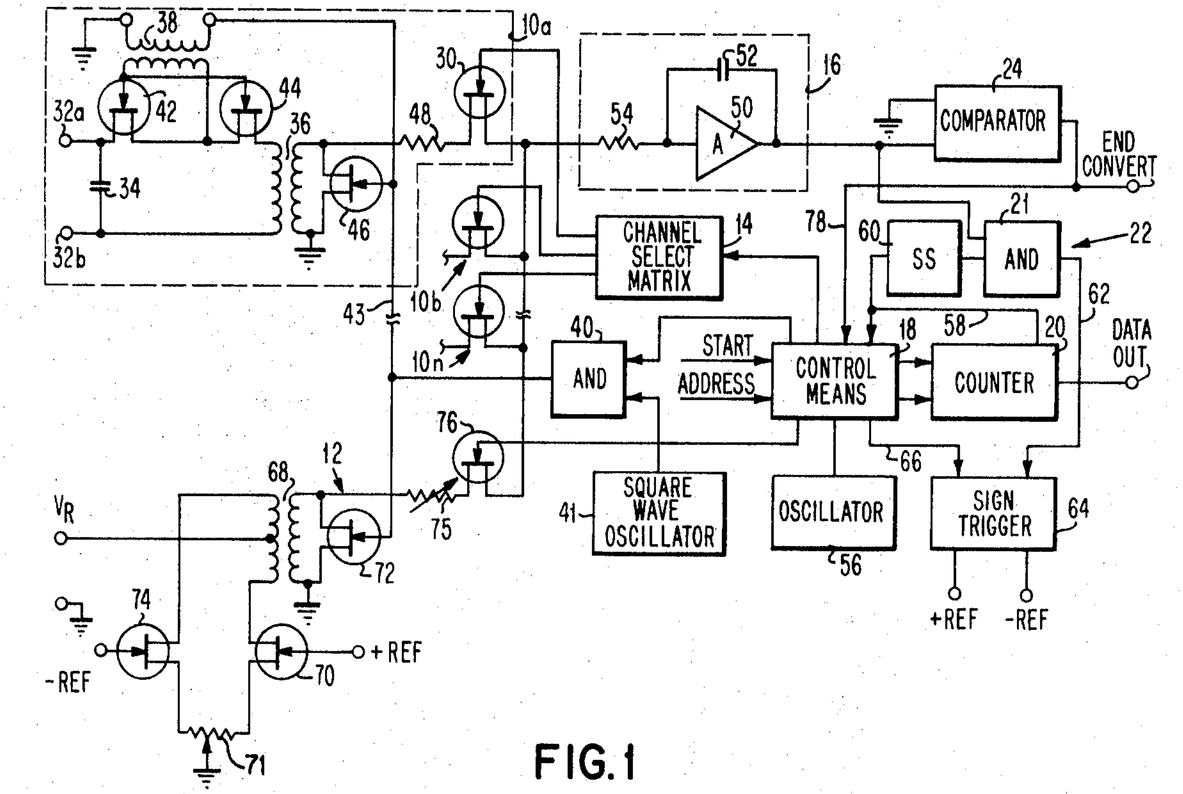
FIG. 1 is a schematic block diagram of a preferred embodiment of a dual ramp integrating analog to digital converter (ADC) embodying the invention.
Figure 2:
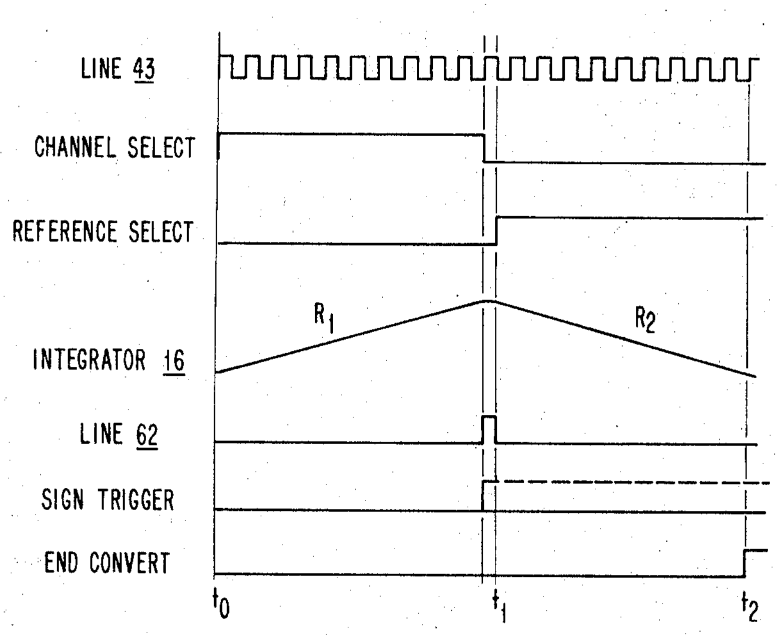
FIG. 2 is a voltage-time diagram showing the ramp voltage and the control signals generated by the ADC circuit of FIG. 1.

DESCRIPTION OF PREFERRED EMBODIMENTS signal analog to digital converter (ADC) which isolated inputs is shown in the drawings. Referring particularly to FIG. 1, a plurality of input signal channel means 10*a*, 10*b* 10*n* is provided to selectively couple an unknown analog input signal to the analog to digital converter for conversion of the analog signal to a digital signal. All of the operations on the ADC are supervised by a control means 18. One of the input signal channel coupling means is selected by channel select means 14 and the signal is coupled to an integrator means 16 to produce the time integral of the unknown analog signal over the predetermined time of integration to produce the ramp voltage $R_1$ as shown in FIG. 2. At the time that the unknown input signal is coupled to integrator 16 a digital representation generating means is also energized for the predetermined time. At the end of the predetermined time, the integration of the input signal is interrupted and the sign of the input signal is sensed by sign detection means 22. A reference signal input channel 12 is then energized to couple a signal of sign opposite to the unknown input signal to integrator means 16. Integration of the reference voltage is continued until detecting means 24 senses that the output of the integrating means has reached its initial level. This integration produces ramp voltage $R_2$ as shown in FIG. 2. The digital representation of the unknown analog signal is then in digital signal generating means 20.

In the embodiment of the invention shown in FIG. 1, operation is shown for a dual integrating ramp ADC embodying my invention. A conversion operation is commenced by a START signal from a suitable means such as from an associated processor in a data processing system. An ADDRESS signal is also supplied and the START and ADDRESS signals are coupled to control means 18. Control means 18 may comprise conventional logic circuits and gating circuits to produce suitable control signals such as those shown in FIG. 2. The address signal is coupled to channel select matrix 14 and the address signal is decoded to select a particular input channel means 10*a* through 10*n*.

Each of the input channel means 10 comprises a pair of input signal terminals 32*a*, 32*b* which couples the input signal across a capacitor 34 and to the primary winding of transformer 36. A second transformer 38 is provided to couple a modulating signal which is gated by AND circuit 40. One input to AND circuit 40 is provided from control means 18 and this input is active when a signal input channel or a reference input channel is selected. The other input to AND circuit 40 is provided by a square wave oscillator 41 which produces a continuous square wave signal. The modulating signal on line 43 comprises a substantially square wave signal when an input channel is selected as shown in FIG. 2, and this signal is coupled across the primary winding of transformer 38. The seondary winding of transformer 38 is coupled to a pair of chopping field effect transistors 42, 44 which are coupled to periodically interrupt the signal applied at the input terminals at a frequency determined by the chopping signal applied to the primary winding of transformer 38. The field effect transistors in the embodiment shown are junction field effect transistors with drain and source coupled in the input line with the gate being coupled to one end of the secondary winding of transformer 38. A signal within a few tenths of a volt of the source and drain applied to the gate terminal is sufficient to turn the transistor ON. The chopping frequency is also applied to a chopping field effect transistor 46 which is coupled across the secondary winding of transformer 36. The output from the secondary of transformer 36 is coupled through a resistor 48 and through a channel select field effect transistor 30 to a summing point at the input of integrator 16.

While the input circuit means for one channel has been described, it is recognized that identical components are provided for the other channels 10*b* —10*n*. Thus, it can be seen that a plurality of input signal channel means is provided and the corresponding input signals can be selected for conversion by a signal from the channel select matrix 14 to the corresponding channel select transistor 30.

Integration means 16 is of conventional construction and in the embodiment shown comprises operational amplifier 50 shunted by capacitor 52 and having series resistor 54 coupled to the input of amplifier 50. Simultaneously with the beginning of integration of the unknown signal, there is started a digital representation generating means 20. In the embodiment shown, generating means 20 comprises an oscillator 56 feeding pulses through control means 18 to step a counter 20. The count in counter 20 begins at zero at the start of the unknown signal integration and continues at a rate determined by the oscillator as the unknown signal is being integrated. When counter 20 reaches its capacity an overflow signal is generated on line 58 and this signal is coupled to control means 18 and a signal is generated in response to this signal to terminate the connection of the unknown signal to the input of integrating means 16. The signal on line 58 is also coupled to sign detections means 22.

In the illustrated embodiment the sensing means 22 comprises a single shot multivibrator 60 and AND circuit 21. To provide a test of the sign of the unknown input signal the output of single shot multivibrator 60 is combined with the output from integrating means 16 in AND circuit 21. The output of single shot multivibrator 60 is chosen to be positive so that if the output of integrating means 16 is positive, an output from AND circuit 60 is produced. This signal is coupled on line 62 to set sign trigger 64. Sign Trigger 64 is always reset by line 66 from control means 18 at the start of a conversion operation to produce an output signal +REF which is operative to choose a positive reference voltage by energizing reference select field effect transistor 70. In the event that the state of trigger 64 is changed by a signal on line 62 (shown dotted in FIG. 2) an output signal –REF provides the signal for minus reference field effect transistor 74 to be selected. Since the embodiment of integrator shown in the drawings inverts the signals from the input to the output, the above described arrangement provides the desired operation of selecting a reference voltage which is of the opposite sign to the unknown input signal.

Once the sign of the input voltage has been established, control means 18 provides a signal to energize field effect transistor 76 to select reference signal input channel 12 to provide a reference voltage of opposite sign to the unknown input voltage to the input of integrating means 16. Reference signal input channel 12 comprises a reference signal source $V_R$ which is coupled to the center tap of the primary winding of transformer 68. The modulating signal on line 43 is coupled to actuate chopping field effect transistor 72 which is coupled across the secondary winding of transformer 68. Transformer 68 has the same characteristics as transformers 36 utilized in input signal channel means 10. Since the transformer output is modulated at the same rate in both unknown and reference channels so that errors tend to cancel, the design characteristics of the transformers are not as critical as transformers utilized in prior art systems. This results in a much less expensive system which has great accuracy due to the error cancellation features produced by the upward and downward integration.

Balance potentiometer 71 is used to compensate for inequality in the +and –reference drive due to transistor and transformer imbalance. The balance potentiometer 71 is adjusted by applying a known full scale input signal to a selected input channel with the converter in a continuous conversion mode of operation. The potentiometer is adjusted until a polarity reversal of the known input signal produces the proper +and –full scale digital representations of the input signal.

Rheostat 75 provides for full scale calibration adjustment with a known full scale input voltage, Calibration is accomplished by applying the known full scale voltage to the unknown input terminals 32*a*, 32*b* of a selected input channel. The converter is operated in a continuous conversion mode of operation and rheostat 75 is adjusted to produce the desired digital representation in counter 20 for the known input signal. Adjustments of potentiometer 71 and rheostat 75 are somewhat interactive and may require several iterations of the above procedures. After initial setup adjustments, the calibration should be checked on a periodic basis such as semiannually, for example, or after any repairs.

Voltage sensing means 24 is provided for detecting when the output voltage of integrating means 16 produced as a result of integration of the reference voltage reaches the initial or reference level. The reference level is the level existing at the input of the integrating means just prior to the start of integration of the unknown signal. In the embodiment shown, the detecting means comprises a comparator and the reference level is essentially ground potential.

When the output voltage of integrating means 16 reaches the reference level, a signal generated on line 78 is coupled to control means 18 to turn off transistor 76 and thereby stop the integration of the reference voltage. At this time the gating of oscillator pulses to step counter 20 is also stopped and the count in the counter at this time is a digital representation of the unknown analog voltage.

It should be noted at this point that the conversion has been completed without the use of a demodulator and filter as required in prior art systems. This not only results in a simpler system using less costly components, but also represents a speed advantage due to the fact that no filter settling time is required.

Figure 3:
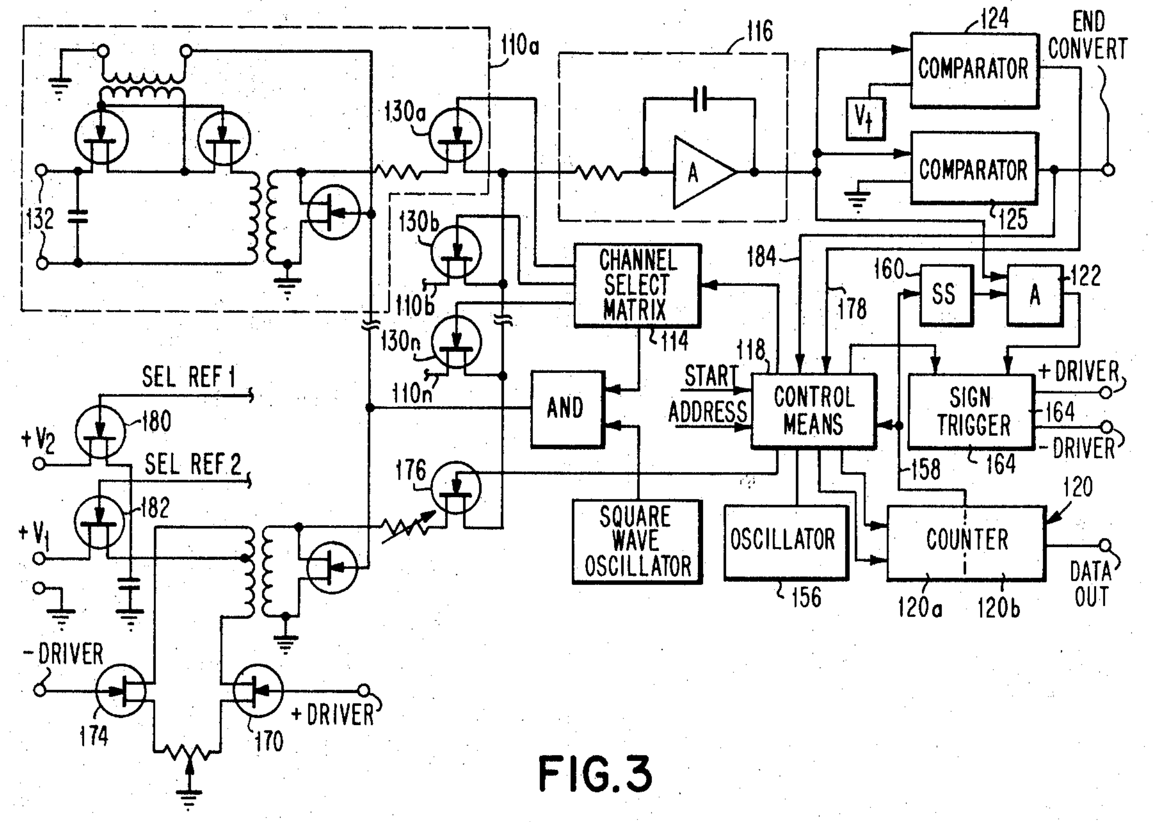
FIG. 3 is a schematic block diagram of a preferred embodiment of a triple ramp integrating ADC embodying the invention.

The apparatus shown in FIG. 3 comprises an embodiment of the invention related to a triple integrating ramp ADC. The triple integrating ramp represents a speed advantage over the dual ramp embodiment and offers a tradeoff between speed and precision for a particular resoluation. The operation is somewhat similar to the dual integrating ramp operation with the exception that the downward integration is carried out in two steps. In this embodiment, counter 120 ultimately contains a digital representation of the unknown voltage shown emanating from source 132. In this case, binary counter 120 is partitioned into two equal sections and two reference voltage sources $V_1$ and $V_2$, are provided. The signals for the selection of the input channel means 110*a*, 110*b* ... 110*n* are provided by channel select matrix 114 to energize the appropriate channel select field effect transistor 130. In this embodiment the output of integrating means 116 is coupled to comparator circuits 124 and 125.

The conversion operation starts at a given initial time $T_0$ and at this time both groups 120*a* and 120*b* of counter 120 are in the zero state and the appropriate input channel select switch 130 is closed by a signal generated by channel select matrix 114 through control means 118 to couple an unknown analog input voltage to the input of integrating means 116 for a fixed period of time which may be equal to the time required to fill counter group 120*a*. Clock pulses from oscillator 156 are gated into counter group 120*a* by control means 118. A signal on line 158 represents an overflow signal from counter group 120*a*. The signal on line 158 is coupled to control means 118 and to sign detecting means comprising single shot multivibrator 160 and AND circuit 122. The signal on line 158 to control means is operative to generate signals for openjng switch 130 and halting the integration of the unknown analog signal. The time integral of the unknown signal over the chosen interval is now stored in integrator circuit 116 and ramp voltage $R_1$ as shown in FIG. 4 is produced.

The remainder of the conversion operation comprises the use of the two reference voltages of sign opposite to the unknown input signal to complete the conversion so that the digital representation of the unknown analog voltage appears in counter 120. The sign of the unknown input voltage is determined in a similar manner to the previously described embodiment utilizing single shot multivibrator 160, AND circuit 122 and sign trigger 164. By this means the appropriate reference select field effect transistor 170 or 174 is energized by the signal from sign trigger 164. A signal is generated from control means 118 to energize reference select transistor 176 and also to provide a signal SEL REF 1 to energize reference select transistor 180.

Figure 4:
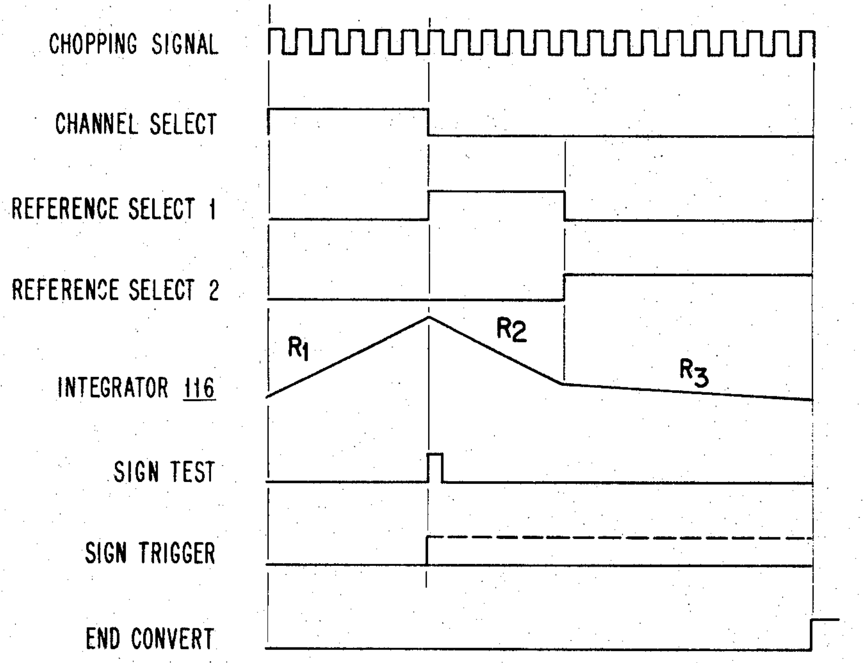
FIG. 4 is a voltage-time diagram showing the ramp voltages and the control signals generated by the ADC circuit of FIG. 3

The first reference voltage is then integrated until the output of integrating means 116 as sensed by comparator 124 has reached an intermediate level $V_t$, during which time ramp $R_2$ as shown in FIG. 4 is produced. This factor is coupled to control means 118 on line 178 and this signal is operative to generate a signal SEL REF 2 to deenergize reference select transistor 180 and energize transistor 182 to select the second reference voltage which is a lower voltage than the first reference voltage and this reference voltage is integrated until comparator 125 senses that the integrator output voltage has reached its initial level (to produce ramp $R_3$ as shown in FIG. 4), at which time a signal is coupled to control means 118 on line 184 which serves to end the integration of the reference voltage so that the digital representation of the unknown analog voltage then appears in counter 120.

While the invention has been particularly shown and described with reference to preferred embodiments thereof, it will be understood by those skilled in the art that various changes in the form and details may be made therein without departing from the spirit and scope of the invention.

I claim:

1. An analog to digital converter for producing comprising digital representation of the magnitude of an analog signal of unknown magnitude comprising:
   a plurality of input signal channel means each comrpsing a transformer, an analog signal source and means for producing a modulated signal proportional to said analog signal through said transformer;
   means for selecting one of said plurality of input signal channels means;
   means for integrating the modulated signal from said selected channel for a predetermined time;
   a reference signal channel means comprising a transformer, a plurality of reference signal sources and means for producing a modulated signal proportional to said reference signal through said transformer;
   means for selectively coupling a reference signal of polarity opposite to the polarity of said analog signal from said reference signal channel means to said integrating means;
   means for detecting when the output of said integrating means reaches its initial level; and
   digital signal generating means responsive to the time of said integration to generate a digital representation of the analog of the input signal.

2. The analog to digital converter according to claim 1 wherein said means for producing a modulated signal comprises:
   a source of electrical pulses;
   a chopping means in said input signal channel means;
   a second transformer connected to couple said electrical pulses to said chopping means to produce said modulated signal.

3. The analog to digital converter according to claim 2 wherein said chopping means comprises a pair of field effect transistors in series in said input channel means.

4. The analog to digital converter according to claim 1 wherein said digital representation generating means comprises;
   a counter;
   a source of pulses; and
   means for selectively gating said pulses to said counter.

5. An analog to digital converter for producing a digital representation of the magnitude of an analog signal of unknown magnitude comprising:
   a plurality of inout signal channel means each comprising a transformer, an analog signal source and means for producing a modulated signal proportional to said analog signal through said transformer;
   means for selecting one of said plurality of input signal channel means;
   means for integrating the modulated signal from said selected channel for a predetermined time;
   a reference signal channel means comprising a transformer, a plurality of reference signal sources and means for producing a modulated signal proportional to said reference signal through said transformer;
   means for selectively coupling a reference signal of polarity opposite to the polarity of said analog signal from said reference signal channel means to said integrating means;
   means for detecting when the output of said integrating means reaches a predetermined level;
   means for selectively coupling a second reference signal of polarity opposite to the polarity of said analog signal from said reference signal channel means to said integrating means;
   means for detecting when the output of said integrating means reaches its initial level; and
   digital signal generating means responsive to the time of said integration to generate a digital representation of the analog input signal.

6. The analog to digital converter according to claim 5 wherein said means for producing a modulated signal comprises:
   a source of electrical pulses;
   a chopping means in said input signal channel means;
   a second transformer connected to couple said electrical pulses to said chopping means to produce said mudulated signal.

7. The analog to digital converter according to claim 6 wherein said chopping means comprises a pair of field effect transistors in series in said input channel means.

8. The analog to digital converter according to claim 5 wherein said digital representation generating means comprises:
   a counter including a cirst group of high order positions and a second group of low order position;
   a source of pulses; and
   means for gating at least one of said pulses into said first group of positions in said counter and subsequently gating at least another of said pulses into said second group of positions in said counter.

9. An analog to digital converter for producing a digital representation of the magnitude of an analog signal of unknown magnitude comprising:
   a plurality of input signal channels each comprising an input signal source, a chopping means and a first transformer;
   a source of pulses;
   a second transformer for selectively coupling said source of pulses to said chopping means in a selected channel to produce at the secondary of the first transformer a modulated signal proportional to the input signal of the selected channel;
   means for integrating the modulated signal for a predetermined time;
   means for detecting the sign of the modulated signal;
   a reference signal channel comprising a plurality of reference signal sources and a third transformer;
   means for selectively coupling a reference signal of opposite sign to the detected sign through the third transformer to the means of integrating;
   means for detecting when the output of the integrating means reaches its initial level; and
   an accumulating means responsive to the time of integration to generate a digital representation of the input signal.